(12) United States Patent
Goto

(10) Patent No.: US 7,521,688 B2
(45) Date of Patent: Apr. 21, 2009

(54) CHARGED-PARTICLE BEAM INSTRUMENT

(75) Inventor: Kazuya Goto, Tokyo (JP)

(73) Assignee: Jeol Ltd., Tokyo (JP)

( * ) Notice: Subject to any disclaimer, the term of this patent is extended or adjusted under 35 U.S.C. 154(b) by 334 days.

(21) Appl. No.: 11/640,693

(22) Filed: Dec. 18, 2006

(65) Prior Publication Data

US 2007/0158563 A1  Jul. 12, 2007

(30) Foreign Application Priority Data

Jan. 11, 2006  (JP) ............................. 2006-3523

(51) Int. Cl.
*H01J 1/50* (2006.01)
(52) U.S. Cl. .................. 250/396 ML; 250/492.21; 250/492.22; 250/492.23; 250/492.2; 250/310; 250/305; 250/306; 250/307; 250/398; 250/396 R
(58) Field of Classification Search ............ 250/492.21, 250/310, 492.22, 492.23, 492.2, 305, 306, 250/396 R, 398, 307, 282, 396 ML
See application file for complete search history.

(56) References Cited

U.S. PATENT DOCUMENTS 7,041,988 B2 *  5/2006  Hamaguchi et al. ...... 250/492.2
7,109,501 B2 *  9/2006  Nagano et al. .......... 250/492.22
7,465,939 B2 * 12/2008  Frosien .................... 250/396 R
2008/0142723 A1 *  6/2008  Goto ....................... 250/396 R

FOREIGN PATENT DOCUMENTS

JP          59083336       5/1984
JP           9073871       3/1997

* cited by examiner

*Primary Examiner*—Jack I Berman
*Assistant Examiner*—Meenakshi S Sahu
(74) *Attorney, Agent, or Firm*—The Webb Law Firm

(57) ABSTRACT

A charged-particle beam instrument is offered which can cancel out deflection aberrations arising from a first deflector or oblique incidence on the surface of a workpiece without (i) increasing the electrode length, (ii) reducing the inside diameter of the electrode, or (iii) increasing the deflection voltage too much. The instrument has an electron source for producing an electron beam, a demagnifying lens for condensing the beam, an objective lens for focusing the condensed beam onto the surface of the workpiece, the first deflector located behind the demagnifying lens, and a second deflector located ahead of the demagnifying lens. The first deflector determines the beam position on the surface of the workpiece. The second deflector cancels out deflection aberrations arising from the first deflector.

4 Claims, 3 Drawing Sheets

CHARGED-PARTICLE BEAM INSTRUMENT

BACKGROUND OF THE INVENTION

1. Field of the Invention

The present invention relates to a charged-particle beam instrument having a plurality of deflectors cooperating to cancel out their mutual deflection aberrations or oblique incidence.

2. Description of Related Art

In recent years, electron beam lithographic systems have become indispensable for manufacture of semiconductor devices.

FIG. 1 schematically shows one example of such an electron beam lithographic system. The system has an electron source 1 (such as a crossover point in an electron gun, an aperture irradiated with an electron beam and used to shape the cross section of the beam, or an image of the crossover point or the shaping aperture), a demagnifying lens 2 for forming an image of the electron source, and an objective lens 3 for focusing the image formed by the demagnifying lens 2 onto a workpiece 5 placed on a stage 4.

A deflector 6 is used such that an electron beam hits a position on the workpiece based on data about a pattern delineation position (hereinafter may be referred to as the pattern delineation position data). That is, the deflector 6 determines the position of the image formed on the workpiece 5. The stage 4 is driven by a stage-driving mechanism 7.

A controller 8 sends a deflection signal corresponding to the pattern delineation position data to the deflector 6 via a D/A converter 9 and via an amplifier 10. The controller 8 also sends a stage-driving signal to the stage-driving mechanism 7 via a D/A converter 12.

A blanking mechanism 13 is composed of a blanking deflector 14 and a blanking plate 15, and acts to blank the electron beam coming from the electron source 1 in response to a blanking signal based on pattern delineation time data sent in from the controller 8. For simplicity of illustration, only one deflector 6 is shown. In practice, there are deflectors for deflections in the X- and Y-directions, respectively. Similarly, there are stages 4 for motions in the X- and Y-directions, respectively.

In the lithographic system of the construction described above, when an actual semiconductor pattern is delineated, the electron beam from the electron source 1 is focused onto the workpiece 5 by the demagnifying lens 2 and objective lens 3. Under this condition, the beam is deflected by the deflector 6 according to the deflection signal based on the pattern position data from the controller 8 to write a desired pattern at a desired location on the workpiece 5.

When the electron beam is deflected by the deflector, deflection aberrations, such as deflection comatic aberration and deflection chromatic aberration, are produced. Furthermore, in such electron beam deflection, there is the problem of oblique incidence on the surface of the workpiece. A known method of suppressing such deflection aberrations and/or oblique incidence consists of mounting an additional deflector and canceling out deflection aberrations in the mutual deflectors and/or oblique incidence (see, for example, JP 59083336).

Even with the electron beam lithographic system shown in FIG. 1, in a case where the electron beam is deflected by the deflector 6, deflection aberrations and oblique incidence take place in the same way as in the foregoing case. This deteriorates the accuracy of deflection and lithography. Accordingly, as shown in FIG. 1, a second deflector 16 is disposed between the demagnifying lens 2 and the first deflector 6 on the electron beam path. The deflectors are cooperated to cancel out the deflection aberrations created by the mutual deflectors and/or oblique incidence. That is, the controller 8 applies a deflection voltage for canceling the aberration in the first deflector 6 and/or oblique incidence to the second deflector 16 via a D/A converter 17 and amplifier 18.

As the aberrations and/or oblique incidence is corrected in this way, the position on the workpiece 5 irradiated by the electron beam varies. Therefore, the deflection voltages to the first deflector 6 and second deflector 16 are determined such that the irradiated position (beam position) remains unchanged.

When the deflection aberrations due to the mutual deflectors are canceled out by cooperation of the first deflector 6 and second deflector 16 as described above, the deflection aberrations are equal in magnitude but opposite in sense (sign). Therefore, where the deflection aberration produced by the first deflector 6 is larger, it is necessary to increase the deflection aberration produced by the second deflector 16 accordingly.

For example, if the deflection range of the electron beam covered by the first deflector 6 is increased to enhance the throughput of the pattern delineation, the deflection aberration increases accordingly. Therefore, the deflection aberration produced by the second deflector 16 must be increased accordingly. The same principle applies to the case where the oblique incidence is canceled out.

If the center position of deflection is not varied, the magnitude of deflection aberration produced by a deflector is determined by the deflection angle. That is, the magnitude depends on the length (electrode length) of the electrode forming the deflector taken along the center axis, electrode-electrode distance (inside diameter of the electrode assuming that the deflector is made of a cylindrical electrode), and the voltage (deflection voltage) applied to the electrode. Accordingly, the deflection aberration is increased by (1) increasing the length of the electrode, (2) reducing the inside diameter of the electrode, (3) increasing the deflection voltage, or (4) using a combination of them.

However, in the optical system shown in FIG. 1, it is difficult to increase the electrode length of the second deflector 16 because of spatial restrictions. Furthermore, if the inside diameter of the electrode of the second deflector 16 is reduced, the inner surface of the electrode is brought accordingly closer to the optical axis of the electron beam. Consequently, the problem that deposition of contaminants arises from scattering electrons tends to be produced more easily. Also, charging effects tend to be produced more frequently.

In addition, in order to improve the throughput, higher-speed operation is necessary. For this purpose, the deflection voltage should be lowered. From this viewpoint, increasing the deflection voltage of the second deflector 16 greatly will result in a detrimental effect.

SUMMARY OF THE INVENTION

It is an object of the present invention to provide a novel charged-particle beam instrument designed to be capable of correcting deflection aberrations in the first deflector or oblique incidence without (i) increasing the electrode length of the second deflector, (ii) reducing the inside diameter of the electrode of the second deflector, or (iii) increasing the deflection voltage of the second deflector as much.

A charged-particle beam instrument according to one embodiment of the present invention has a charged-particle beam source for producing a beam of charged particles, a demagnifying lens for condensing the beam of charged particles, an objective lens for focusing the condensed beam onto a surface of a workpiece to be irradiated with the beam, a first deflector located behind the demagnifying lens and determining a beam position on the surface of the workpiece irradiated with the beam, and a second deflector located ahead of the demagnifying lens and canceling out deflection aberrations produced by the first deflector or oblique incidence of the beam on the surface of the workpiece.

In this charged-particle beam instrument, the second deflector for canceling out the deflection aberrations in the first deflector or oblique incidence of the beam on the surface of the workpiece is placed ahead of the demagnifying lens. Consequently, the angle of deflection made by the second deflector is magnified by the demagnifying lens and so the deflection voltage applied to the second deflector can be suppressed to such a low level that the deflection speed of the deflector is not adversely affected.

Other objects and features of the invention will appear in the course of the description thereof, which follows.

DESCRIPTION OF THE PREFERRED EMBODIMENTS

Embodiments of the present invention are hereinafter described in detail with reference to the drawings. The description of the embodiments centers on cancellation of aberrations for the sake of convenience of illustration; description of cancellation of oblique incidence is omitted.

Figure 1:
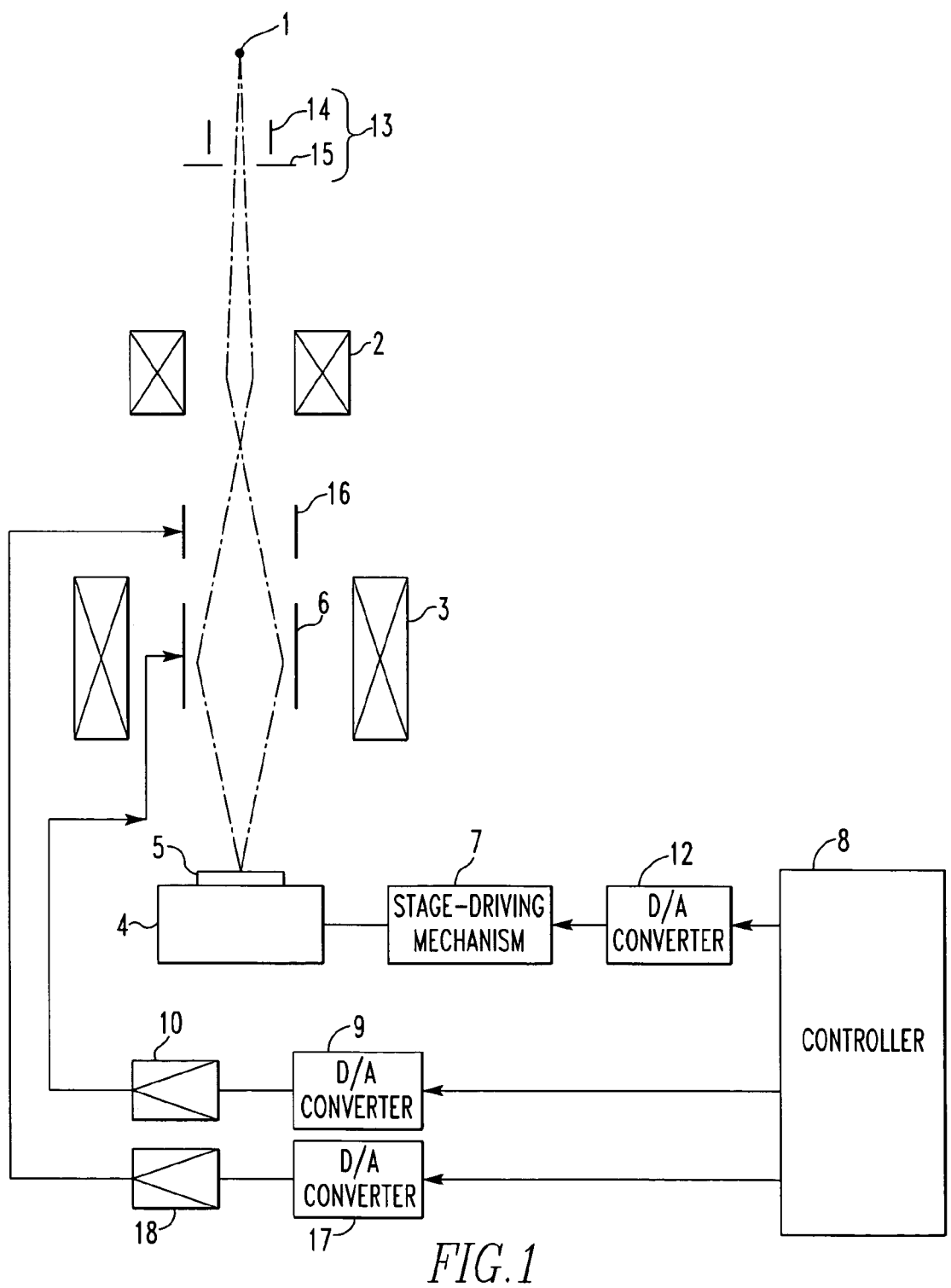
FIG. 1 is a schematic block diagram of an electron beam lithographic system.
Figure 2:
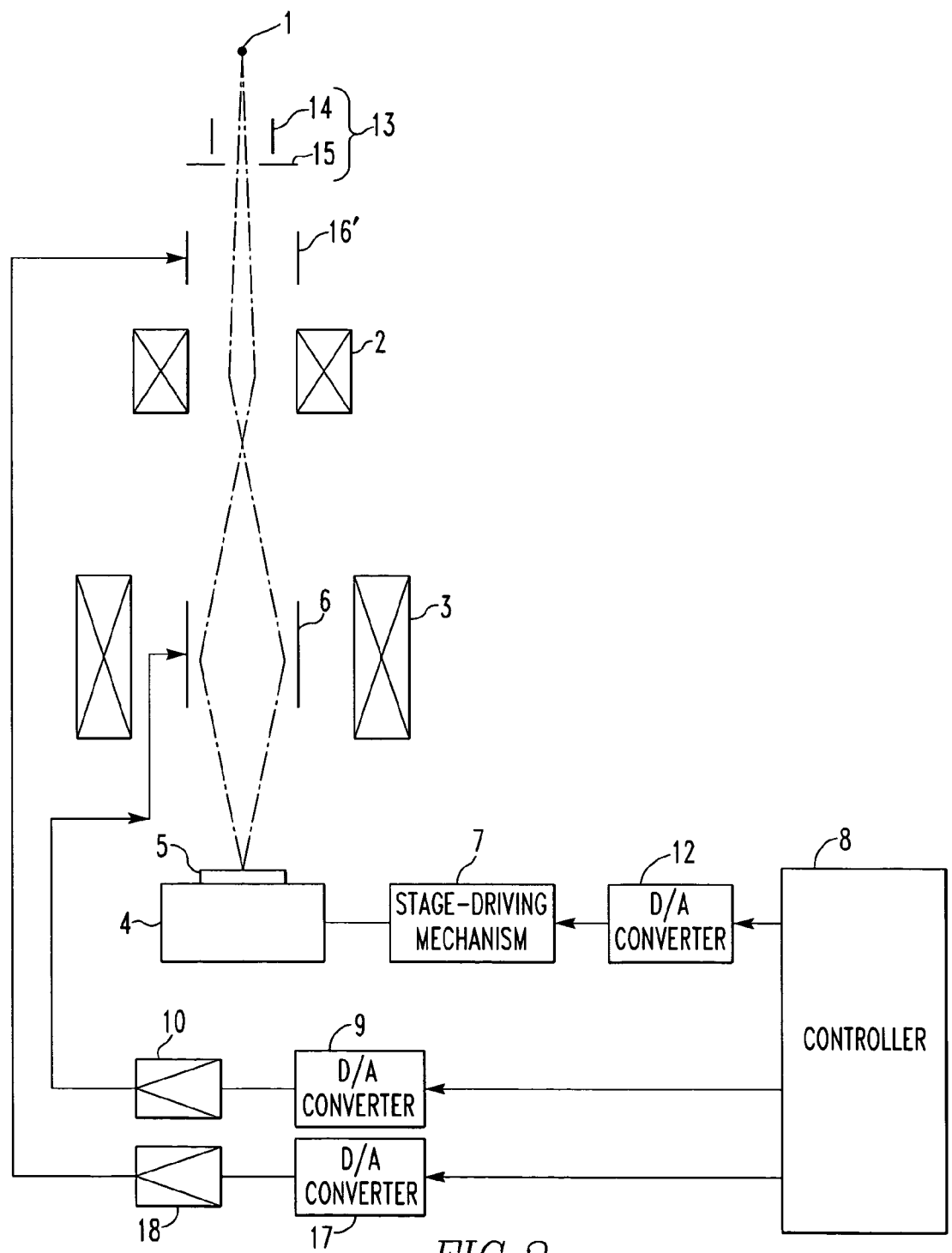
FIG. 2 is a schematic block diagram of a charged-particle beam instrument according to an embodiment of the present invention.

FIG. 2 schematically shows a charged-particle beam instrument according to one embodiment of the present invention. Note that like components are indicated by like reference numerals in both FIGS. 1 and 2.

The charged-particle beam instrument shown in FIG. 2 is similar to the charged-particle beam instrument already described in connection with FIG. 1 except that the second deflector 16' is placed ahead of the demagnifying lens 2 (between the electron source 1 and the demagnifying lens 2).

In this structure, if the tilt of the trajectory of the electron beam deflected by the second deflector 16' is increased by the use of the focusing action of the demagnifying lens 2, the deviation of the beam from the center of the magnetic or electric field produced by the objective lens 3 increases. The deflection aberration created by the second deflector 16' increases accordingly.

The conditions under which the tilt of the trajectory of the electron beam deflected by the second deflector 16' is magnified by the demagnifying lens 2 are next described.

Figure 3:
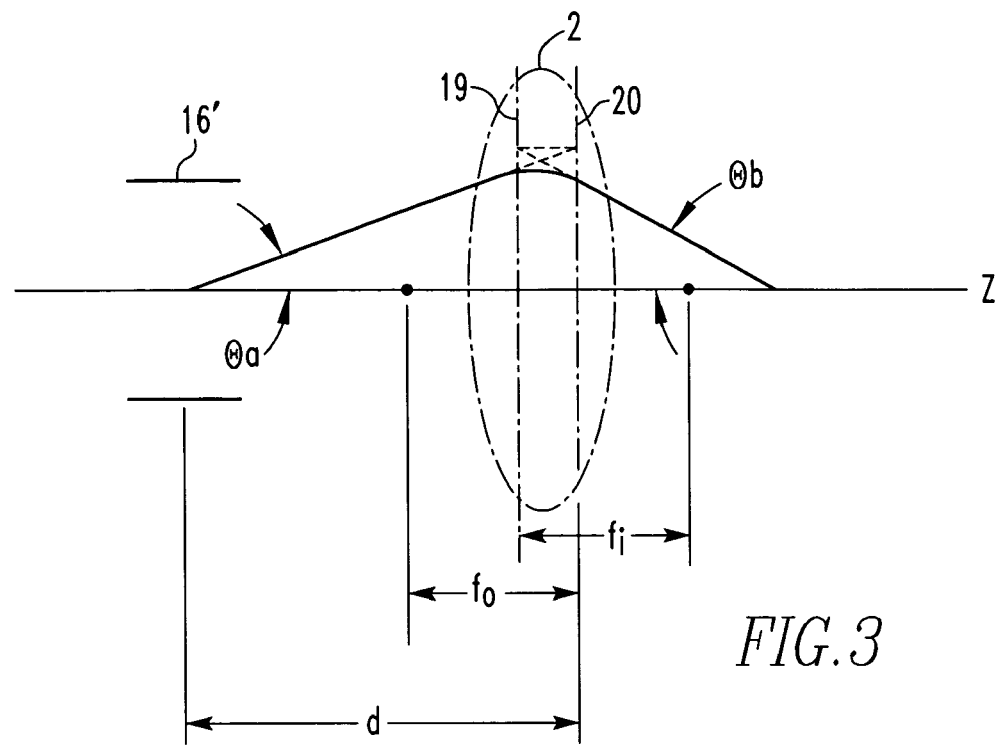
FIG. 3 is a ray diagram of the trajectory of a principal beam, illustrating the manner in which an electron beam deflected by a deflector 16' for aberration correction in the instrument shown in FIG. 2 undergoes a focusing action from a demagnifying lens 2.

FIG. 3 is a ray diagram of the trajectory of the principal beam, illustrating the manner in which the electron beam deflected by the second deflector 16' undergoes a focusing action from the demagnifying lens 2. The center axis is indicated by z. The principal plane on the image side of the demagnifying lens 2 is indicated by 19. The principal plane on the object side of the demagnifying lens 2 is indicated by 20. The center of deflection of the second deflector 16' is at a distance of d from the principal plane 20 on the object side of the demagnifying lens. The demagnifying lens 2 has a focal distance of $f_0$ on the object side. The demagnifying lens 2 has a focal distance of $f_i$ on the image side. The principal electron beam is tilted at an angle of $\theta_a$ by the deflection made by the second deflector 16' relative to the center axis z. The principal electron beam passed through the demagnifying lens 2 is tilted at an angle of $\theta_b$ relative to the center axis z.

Figure 4:
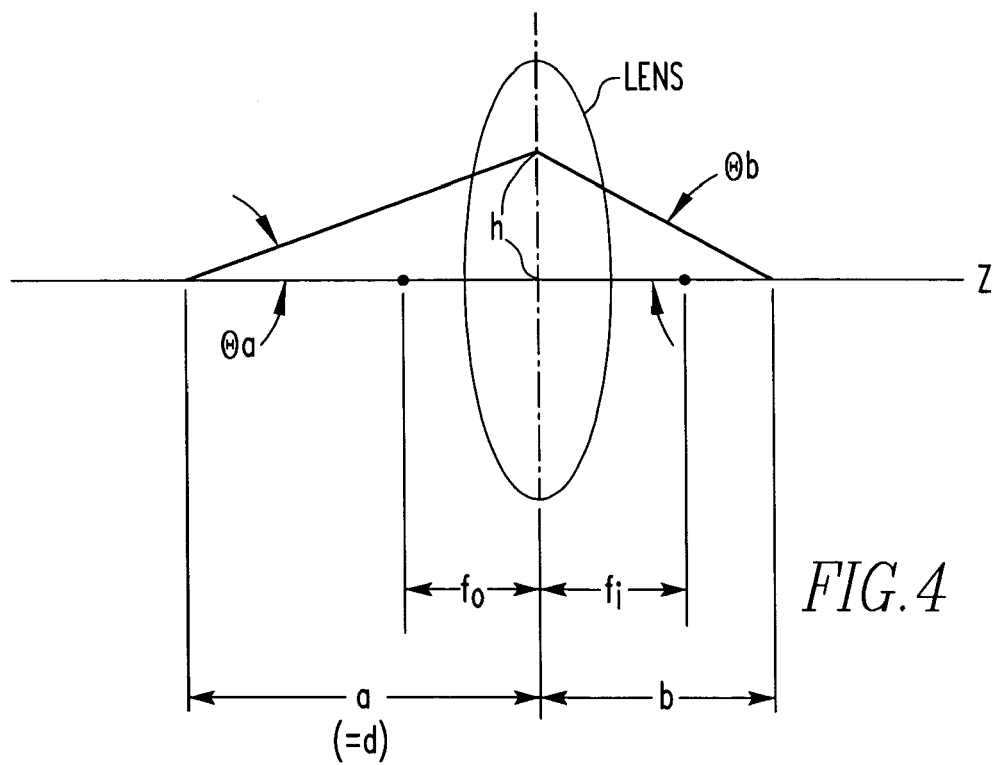
FIG. 4 is a general ray diagram of the trajectory of a principal beam, illustrating the manner in which an electron beam undergoes a focusing action from a lens.

In this ray diagram, a well-known set of formulas about lenses (schematic ray diagram of FIG. 4), i.e., $$\frac{f_0}{d} + \frac{f_i}{b} = 1$$

$$\theta_a = \frac{h}{d}$$

$$\theta_b = \frac{h}{b}$$

leads to the following relational expression $$\frac{\theta_b}{\theta_a} = \frac{d - f_0}{f_i}$$

It can be seen from the relational expression that if $d > f_0 + f_i$, then the relation $\theta_b > \theta_a$ holds.

That is, if the center of deflection of the second deflector 16' is spaced by a distance greater than the sum of the focal distance on the object side of the demagnifying lens 2 and the focal distance on the image side from the principal plane on the object side of the demagnifying lens 2 toward the electron source 1, the angle of deflection made by the second deflector 16' is magnified by the demagnifying lens 2.

In the lithographic system of the construction described above, when an actual semiconductor pattern is delineated, the electron beam from the electron source 1 is focused onto the workpiece 5 by the demagnifying lens 2 and objective lens 3. Under this condition, the beam is deflected by the first deflector 6 according to a deflection voltage signal based on pattern position data supplied from the controller 8. As a result, a desired pattern is delineated at a desired position on the workpiece 5.

During this lithographic process, a deflection voltage responsive to the deflection voltage applied to the first deflector 6 is applied to the second deflector 16'. The beam is deflected so as to cancel out the deflection aberration produced by the first deflector 6. Since the second deflector 16' is so positioned that the angle of deflection made by the second deflector 16' is magnified by the demagnifying lens 2 as described previously, the deflection voltage to the second deflector 16' is suppressed to such an extent that the deflection speed of the deflector is not adversely affected.

The above-described embodiment is a deflection system in which the two deflectors, i.e., first deflector 6 and second deflector 16', are made to operate cooperatively. Consequently, in principle, only one of the comatic aberration and chromatic aberration arising from the first deflector 6 can be canceled out except in special cases. Accordingly, a third deflector may be disposed between the electron source 1 and the workpiece 5 (e.g., between the demagnifying lens 2 and second deflector 16'), and the three deflectors may be operated cooperatively to cancel out the two aberrations. Alternatively, one aberration and oblique incidence may be canceled out simultaneously.

It is to be understood that the present invention is not limited to an electron beam lithographic system. The invention can also be applied to other charged-particle beam instruments, such as electron microscope and focused ion beam instrument.

Having thus described my invention with the detail and particularity required by the Patent Laws, what is desired protected by Letters Patent is set forth in the following claims.

The invention claimed is:

1. A charged-particle beam instrument comprising:
   a charged-particle beam source for producing a beam of charged particles;
   a demagnifying lens for condensing the beam of charged particles;
   an objective lens for focusing the condensed beam onto a surface of a workpiece to be irradiated with the beam;
   a first deflector located behind the demagnifying lens and determining a beam position on the surface of the workpiece irradiated with the beam; and
   a second deflector located ahead of the demagnifying lens and canceling out deflection aberrations produced by the first deflector or oblique incidence of the beam on the surface of the workpiece.

2. A charged-particle beam instrument as set forth in claim 1, wherein the center of deflection made by said second deflector is spaced by a distance greater than the sum of a focal distance of the demagnifying lens on the object side and a focal distance on the image side from a principal plane on the object side of the demagnifying lens toward the charged-particle beam source.

3. A charged-particle beam instrument as set forth in claim 1, wherein a deflection voltage applied to said second deflector is varied in response to a deflection voltage applied to said first deflector.

4. A charged-particle beam instrument as set forth in claim 1, wherein there is further provided a third deflector different from said first deflector and from said second deflector, and wherein deflection voltages applied to the three deflectors, respectively, are varied cooperatively to cancel out either two kinds of deflection aberrations at the same time or one kind of deflection aberration and oblique incidence of the beam on the surface of the workpiece.

* * * * *